US007413481B2

(12) United States Patent
Redmond, III et al.

(10) Patent No.: US 7,413,481 B2
(45) Date of Patent: Aug. 19, 2008

(54) SYSTEMS FOR AND METHODS OF CIRCUIT CONSTRUCTION

(76) Inventors: Frank E. Redmond, III, 13382 NE. 134th Pl., Kirkland, WA (US) 98034; Frank E. Redmond, Jr., 6729 N. Hamlin Shoals, Ludington, MI (US) 49431

( * ) Notice: Subject to any disclaimer, the term of this patent is extended or adjusted under 35 U.S.C. 154(b) by 0 days.

(21) Appl. No.: 10/892,880

(22) Filed: Jul. 15, 2004

(65) Prior Publication Data

US 2005/0070163 A1    Mar. 31, 2005

Related U.S. Application Data

(60) Provisional application No. 60/506,272, filed on Sep. 26, 2003.

(51) Int. Cl.
    *H01R 9/22*      (2006.01)
(52) U.S. Cl. .................. 439/717; 439/49; 439/928
(58) Field of Classification Search ............. 439/49 X, 439/507, 511, 717 I, 928 X, 49, 717; 361/735, 361/790, 730, 744
See application file for complete search history.

(56) References Cited

U.S. PATENT DOCUMENTS

| | | | | |
|---|---|---|---|---|
| 3,277,589 A | * | 10/1966 | Berdan et al. | 434/224 |
| 3,546,793 A | * | 12/1970 | Roelofs et al. | 434/118 |
| 3,643,135 A | * | 2/1972 | Devore et al. | 361/730 |
| 3,701,079 A | * | 10/1972 | Bowden et al. | 439/892 |
| 3,771,104 A | * | 11/1973 | Clark | 439/415 |
| 3,833,838 A | * | 9/1974 | Christiansen | 361/777 |
| 3,845,573 A | * | 11/1974 | Kasamatsu | 434/224 |
| 4,423,465 A | * | 12/1983 | Teng-Ching et al. | 361/730 |
| 4,658,375 A | * | 4/1987 | Onogi et al. | 710/2 |
| 4,765,471 A | * | 8/1988 | Murphy | 206/719 |
| 4,950,178 A | * | 8/1990 | Harvey et al. | 439/507 |
| 5,103,976 A | * | 4/1992 | Murphy | 206/719 |
| 5,321,203 A | * | 6/1994 | Goto et al. | 174/48 |
| 5,333,733 A | * | 8/1994 | Murata | 206/714 |
| 5,493,194 A | * | 2/1996 | Damiano et al. | 318/575 |
| 5,775,046 A | * | 7/1998 | Fanger et al. | 52/590.1 |
| 5,808,530 A | * | 9/1998 | Kalonji et al. | 333/260 |
| 5,988,394 A | * | 11/1999 | Emoto et al. | 206/724 |
| 6,081,048 A | * | 6/2000 | Bergmann et al. | 307/147 |
| 6,102,232 A | * | 8/2000 | Lin et al. | 220/23.4 |
| 6,331,938 B1 | * | 12/2001 | Hsieh et al. | 361/735 |
| 6,572,403 B2 | * | 6/2003 | Reimund et al. | 439/507 |
| 6,843,684 B2 | * | 1/2005 | Milan | 439/606 |
| 6,881,101 B2 | * | 4/2005 | Sichner et al. | 439/717 |

* cited by examiner

*Primary Examiner*—Thanh-Tam T Le
(74) *Attorney, Agent, or Firm*—Graybeal Jackson Haley LLP

(57) ABSTRACT

A circuit comprises a first circuit portion that includes an electrically insulative first body having a first connector and a first circuit element coupled to the first body. The circuit further comprises a second circuit portion that includes an electrically insulative second body having a second connector coupled to the first connector and a second circuit element coupled to the second body. The circuit further comprises a first electrical conductor coupled to the first and second circuit elements.

17 Claims, 3 Drawing Sheets

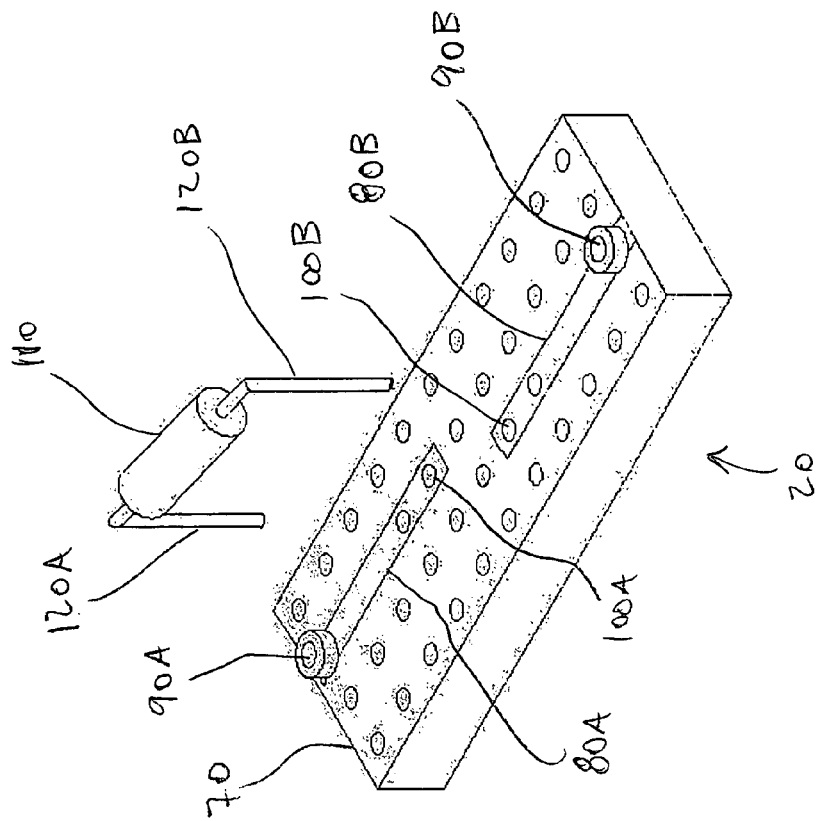
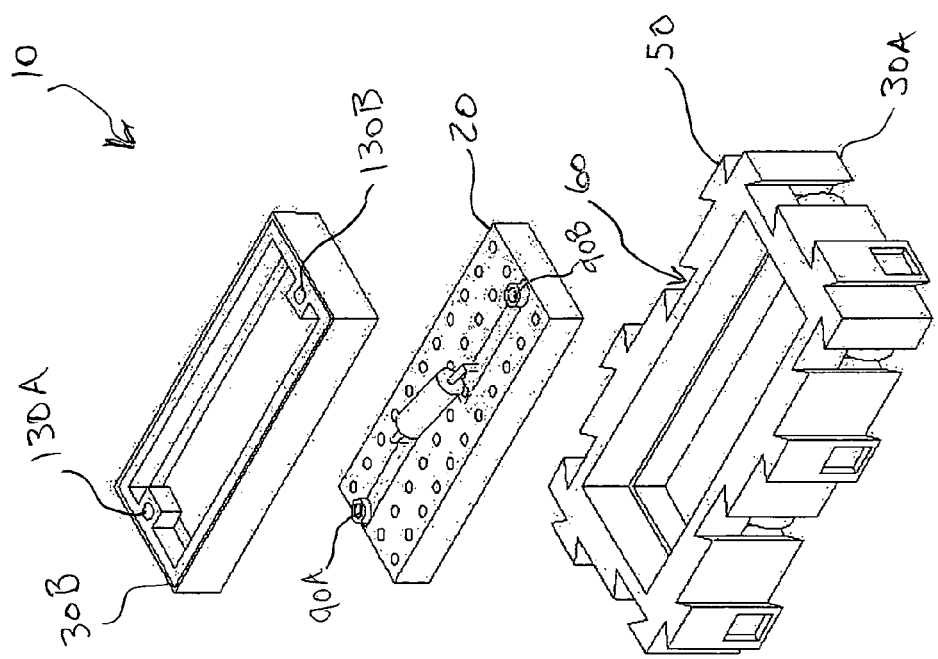

US 7,413,481 B2

SYSTEMS FOR AND METHODS OF CIRCUIT CONSTRUCTION

CROSS REFERENCE TO RELATED APPLICATION

This application claims priority from U.S. provisional patent application No. 60/506,272, filed Sep. 26, 2003, which is hereby incorporated by reference herein.

BACKGROUND

In the field of electronics, it is often desirable to construct a working model of an electric circuit, a circuit being multiple electric components interconnected in one (or more) closed signal routes to perform a desired electrical or electronic function. A working model of an electric circuit may serve a number of purposes, such as, for example, a preliminary pattern serving as the plan from which a circuit not yet constructed will be produced, or a tentative description of a theoretical circuit that accounts for all of the known properties of the circuit.

Existing circuit modeling systems (such as those associated with, for example, breadboards, wire-wrap boards, etc.) typically involve mounting multiple electrical components and/or prepackaged electrical circuits (themselves consisting of multiple electrical components) to a single shared surface (e.g. board) using a single interconnection that is both electrical (i.e. electrically conductive) and mechanical.

Among the problems associated with interconnecting packaged electrical components and circuits to a single shared surface is the fact that the resulting surface (e.g. board) is preformed (i.e., its size and shape are predefined) and difficult to alter. As such, these circuits do not readily lend themselves to component-by-component reconfiguration, which is often required when designing and/or experimenting with circuits for particular purposes.

SUMMARY

According to an embodiment of the present invention, a circuit comprises a first circuit portion that includes an electrically insulative first body having a first connector and a first circuit element coupled to the first body. The circuit further comprises a second circuit portion that includes an electrically insulative second body having a second connector coupled to the first connector and a second circuit element coupled to the second body. The circuit further comprises a first electrical conductor coupled to the first and second elements.

BRIEF DESCRIPTION OF THE DRAWINGS

FIG. 1 is an exploded isometric perspective view of a circuit portion according to an embodiment of the invention;

FIG. 2 is an exploded isometric perspective view of the circuit board portion 20 of the circuit portion 10 illustrated in FIG. 1;

DETAILED DESCRIPTION

Figure 3:
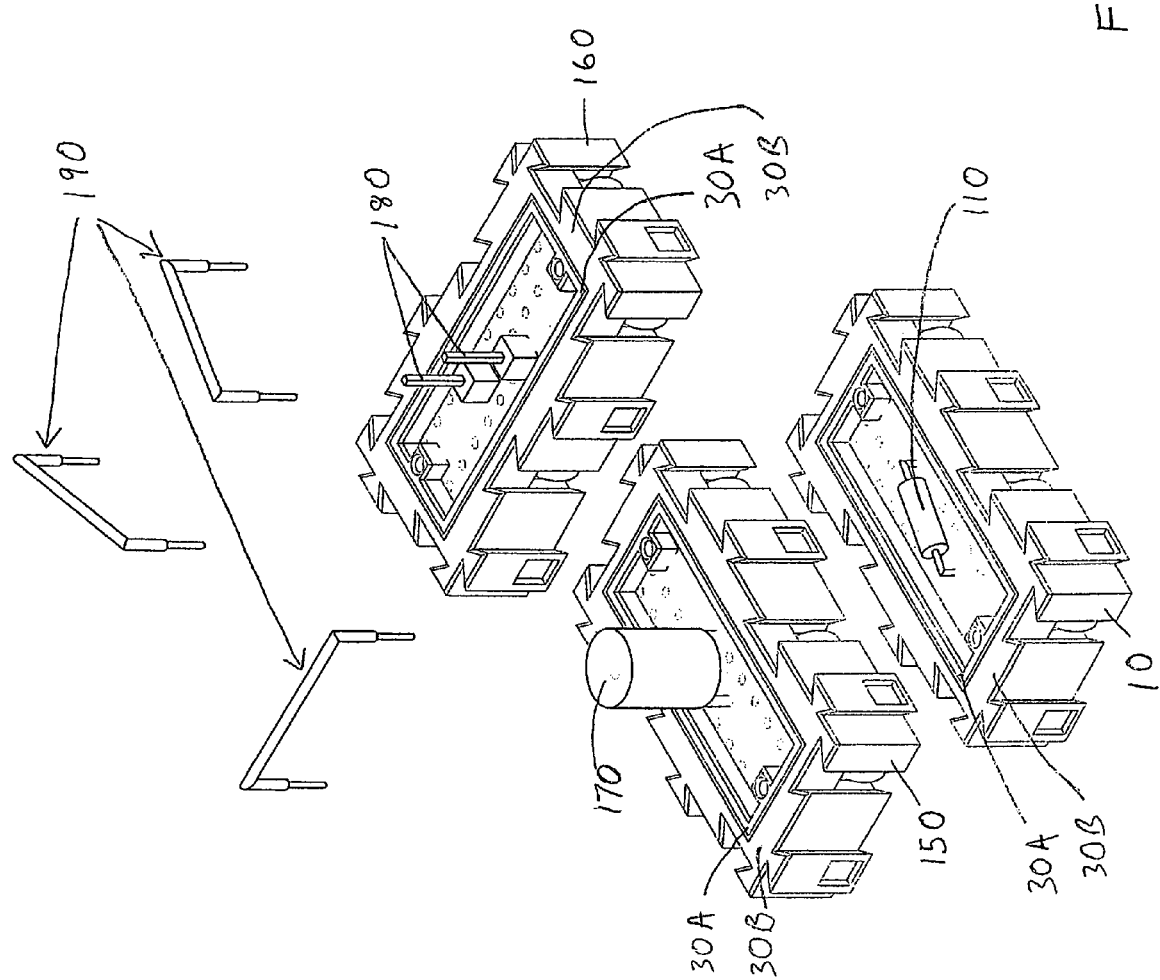
FIG. 3 is an exploded isometric perspective view of a circuit according to an embodiment of the invention.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like reference numbers signify like elements throughout the description of the figures.

FIG. 1 is an exploded isometric perspective view of a circuit portion 10 according to an embodiment of the invention. The circuit portion 10 includes a circuit board portion 20 that may be enclosed, when the circuit portion 10 is fully assembled, within a body portion 30 that includes a bottom portion 30A and a top portion 30B. As is illustrated in FIG. 1, the bottom portion 30A of the body portion 30 includes, in an embodiment, a series of male connectors 50 and female connectors 60 around the perimeter of the bottom portion 30A of the body portion 30. As discussed in further detail below, the male connectors 50 and female connectors 60 enable attachment of the circuit portion 10 to a similarly configured circuit portion.

FIG. 2 is an exploded isometric perspective view of the circuit board portion 20 of the circuit portion 10 illustrated in FIG. 1. The circuit board portion 20 includes a board 70 that, in an embodiment, consists of an insulating material, such as epoxy, resin or other material, known in the art, suitable for construction of a circuit board. In an embodiment, the board 70 includes multiple board leads 80A, 80B consisting of a conductive material, such as copper foil or other suitable conductive material. Although the board 70 illustrated in FIG. 2 includes only two leads, the board may have, in varying embodiments, more or fewer than two leads.

As illustrated in FIG. 2, each lead 80A, 80B includes a first terminal 90A, 90B, which may be elevated above a surface of the circuit board 70, and a second terminal 100A, 100B. In the illustrated embodiment, the terminals 90A, 90B, 100A, 100B comprise a recess or hole in a surface of the circuit board 70. It should be noted, however, that the terminals 90A, 90B, 100A, 100B need not comprise a recess or hole, but may instead comprise any other connective terminal configuration known in the art.

The circuit board portion 20 may further include a circuit element 110. The circuit element 110 may be a resistor, capacitor, cell, diode, or any other well-known component used to construct an electrical circuit. In an embodiment, the circuit element 110 includes element leads 120A, 120B operable to be received by respective terminals 100A, 100B. When the terminals 100A, 100B receive the element leads 120A, 120B, the circuit board leads 80A, 80B and, consequently, the terminals 90A and 90B are electrically coupled to the circuit element 110.

As is shown in FIG. 1 and FIG. 2, the top 30B of the body portion 30 includes body portion holes 130A, 130B. When the board portion 20 is situated within the body portion 30, the body portion holes 130A, 130B are coaxial with respective terminals 90A, 90B. Accordingly, and as further discussed below, an object external to the portion 10 may be brought into contact with a terminal 90A, 90B by inserting such object into a corresponding body portion hole 130A, 130B.

Figure 4:
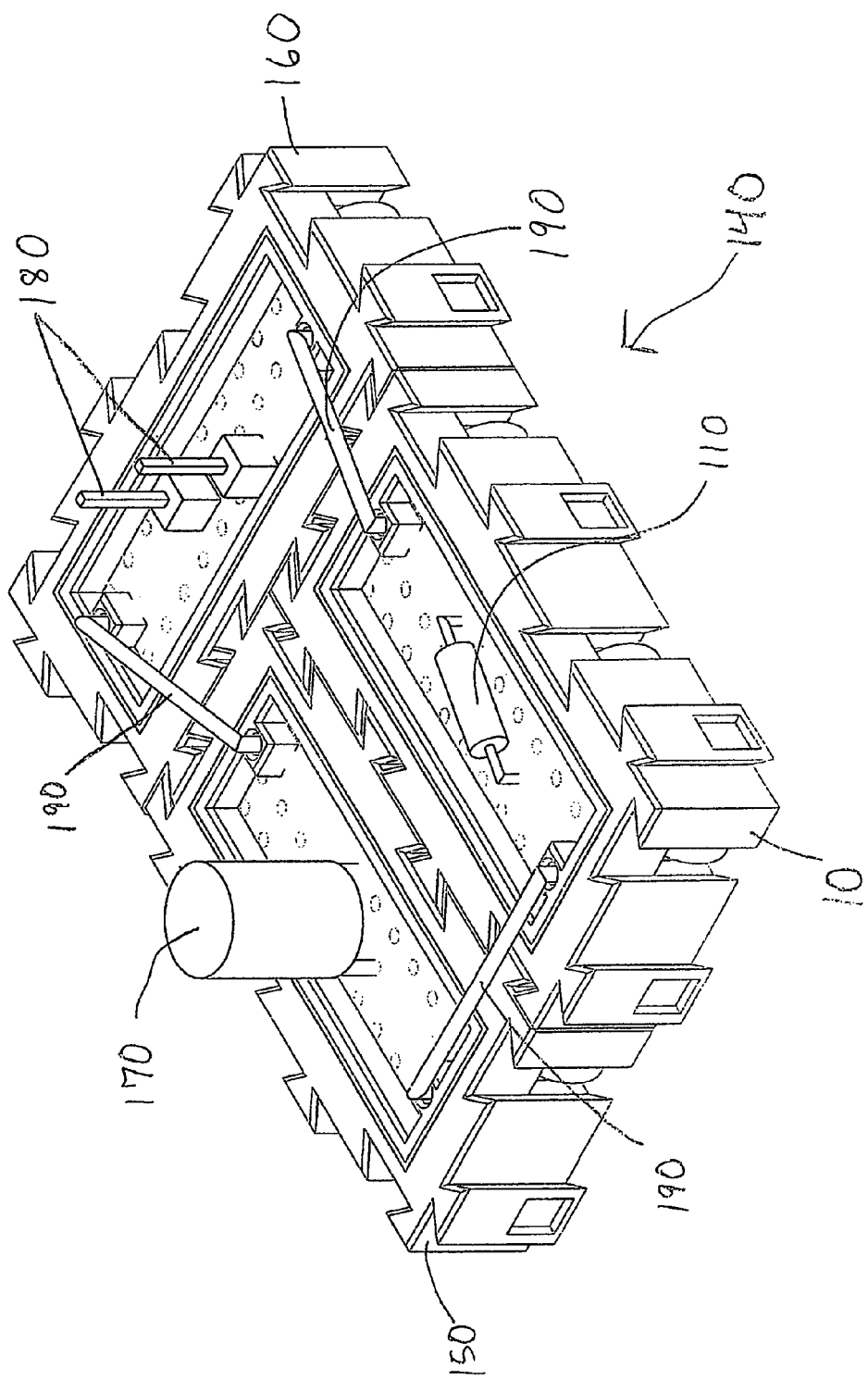
FIG. 4 is an isometric perspective view of the circuit of FIG. 3 in an assembled state.

FIG. 3 illustrates an exploded isometric perspective view of a circuit 140, an assembled embodiment of which is illustrated in FIG. 4. In the illustrated embodiment, the circuit 140 consists of three circuit portions 10, 150, 160. The circuit portions 150, 160 have a general configuration identical to that of the circuit portion 10 described above in detail. As can be seen in both FIGS. 3 and 4, each circuit portion 150, 160 includes a respective circuit element 170, 180 that may be, but is not necessarily, different in function from the circuit element 110 of the circuit portion 10.

An important feature of an embodiment of the invention is that the circuit portions 10, 150, 160 can be physically attached to one another without there existing an electrical coupling between or among such physically attached circuit portions 10, 150, 160. In constructing the circuit 140, the circuit portions 10, 150, 160 may be attached to one another, as best shown in FIG. 4, by their respective corresponding male and female connectors 50, 60. It should be understood that, while male/female connectors are employed in the illustrated embodiments, the circuit portions 10, 150, 160 may be attached or otherwise connected physically to one another in a number of ways known in the art. These physical connections may be removable (i.e., non-permanent) such that the portions 10, 150, 160 may be easily coupled to and decoupled from one another.

Once the circuit portions 10, 150, 160 are physically attached to one another, electrically conductive lead pins 190 may be inserted into corresponding body portion holes (such as the holes 130A and 130B associated with portion 10) of the circuit portions 10, 150, 160. The conductive pins 190, once inserted into the body portion holes, electrically contact a corresponding one of the terminals (such as the terminals 90A and 90B associated with portion 10) of the circuit portions 10, 150, 160. As a result, the circuit elements 110, 170, 180 can be electrically coupled to one another via the lead pins 190. For example, by inserting one end of a pin 190 into a body portion hole of the portion 150 and by inserting the other end of the same pin 190 into a body portion hole of the portion 10, the circuit elements 170 and 110 are electrically coupled to each other.

The preceding discussion is presented to enable a person skilled in the art to make and use the invention. Various modifications to the disclosed embodiments will be readily apparent to those skilled in the art, and the generic principles herein may be applied to other embodiments and applications without departing from the spirit and scope of the present invention. Thus, the present invention is not intended to be limited to the embodiments shown, but is to be accorded the widest scope consistent with the principles and features disclosed herein.

What is claimed is:

1. A circuit, comprising:
   a first circuit body bottom having a first circuit element on a first circuit board contained within the first circuit body, said first circuit body having four sides wherein each side of the circuit body said has male or female connectors or both male and female connectors, wherein said male and female connectors are electrically insulative, enabling the circuit body to attach to one or more other circuit bodies without creating an electrical coupling between the circuit bodies;
   a second circuit body having a second circuit element on a second circuit board wherein the second circuit board is contained on or within the second circuit body, and wherein said second circuit body has four sides, wherein each side has male or female connectors or both male and female connectors, wherein said male and female connectors are electrically insulative, enabling the second circuit body to attach to one or more other circuit bodies without creating an electrical coupling between the circuit bodies;
   wherein said first circuit body is attached to said second circuit body by means of the male and/or female connectors wherein said male and female connectors are electrically insulative, and wherein said first circuit element contained on said first circuit board is electrically coupled to the second circuit element contained on the second circuit board.

2. The circuit of claim 1 wherein the circuit elements are selected from the group consisting of a resistor, capacitor, cell, diode and any other electrical element used to construct an electrical circuit.

3. The circuit of claim 1 wherein each circuit body contains a top and a bottom.

4. The circuit of claim 1, further comprising a third circuit body, a third circuit element contained on a third circuit board on or within said third circuit body, wherein said third circuit body is coupled with either the first or second circuit body or to both the first and second circuit bodies without creating an electrical coupling between the circuit bodies and wherein said third circuit element is electrically connected to the first or second circuit elements or to both the first and second circuit elements.

5. The circuit of claim 4 wherein the third circuit element is selected from the group consisting of a resistor, capacitor, cell, diode and any other electrical element used to construct an electrical circuit.

6. A method for constructing a circuit comprising:
   obtaining a plurality of circuit bodies, wherein each circuit body has four sides, wherein each side has male or female connector(s) or both male and female connectors, wherein said male and female connectors are electrically insulative and wherein each circuit body contains a circuit element on a circuit board;
   connecting each circuit body to another circuit body bottom without creating an electrical coupling between the circuit bodies; and
   electrically coupling each circuit element contained on each circuit board to another circuit element on another circuit board wherein each circuit board is contained on or within a circuit body.

7. The method of claim 6 wherein each side on a circuit body has male or female connectors or male and female connectors, wherein said male and female connectors are electrically insulative, enabling said circuit bodies to connect to each other without creating an electrical coupling between the circuit bodies.

8. The method of claim 6 wherein each circuit element contained on a circuit board within the circuit bodies is comprised of an electrical element selected from the group consisting of a resistor, capacitor, cell, a diode and any other electrical element used to construct an electrical circuit.

9. The method of claim 6 wherein each circuit body has a top and a bottom.

10. A circuit, comprising:
    a first circuit body having a first circuit element on a first circuit board wherein the first circuit board is contained on or within the first circuit body, said first circuit body having four sides, wherein each side of the circuit body has connectors enabling the circuit body to attach to one or more other circuit bodies wherein said connectors are electrically insulative;
    a second circuit body having a second circuit element on a second circuit board, wherein the second circuit board is contained on or within the second circuit body, and wherein said second circuit body has four sides, wherein each side has connectors enabling the second circuit body to attach to one or more other circuit bodies wherein said connectors are electrically insulative; and
    wherein said first circuit body is attached to said second circuit body by means of the connectors without creating an electrical coupling between the circuit bodies and wherein said first circuit element contained on said first circuit board is electrically coupled to the second circuit element contained on the second circuit board.

11. The circuit of claim 10 wherein the circuit elements are selected from the group consisting of a resistor, capacitor, cell, diode and any other electrical element used to construct an electrical circuit.

12. The circuit of claim 10 wherein each circuit body contains a top and a bottom.

13. The circuit of claim 10, further comprising a third circuit body, a third circuit element contained on a third circuit board on or within said third circuit body, wherein said third circuit body is coupled with either the first or second circuit body or to both the first and second circuit bodies without creating an electrical coupling between the circuit bodies and wherein said third circuit element is electrically connected to the first or second circuit elements or to both the first and second circuit elements.

14. The circuit of claim 13 wherein the third circuit element is selected from the group consisting of a resistor, capacitor, cell, diode and any other electrical used to construct an electrical circuit.

15. A method for constructing a circuit comprising:

obtaining a plurality of circuit bodies, wherein each circuit body has four sides, wherein each side has connector(s) wherein said connectors are electrically insulative and wherein each circuit body contains a circuit element on a circuit board;

connecting each circuit body to another circuit body without creating an electrical coupling between the circuit bodies; and electrically coupling each circuit element on each circuit board on or within a circuit body to another circuit element on a circuit board contained on or within a separate circuit body.

16. The method of claim 15 wherein each circuit element selected from the group consisting of a resistor, capacitor, cell, and a diode and any other electrical element used to construct an electrical circuit.

17. The method of claim 15 wherein each circuit body has a top and a bottom.

* * * * *